United States Patent
Hohenwarter et al.

(10) Patent No.: US 10,068,792 B2
(45) Date of Patent: Sep. 4, 2018

(54) METHOD AND APPARATUS FOR LIQUID TREATMENT OF WAFER SHAPED ARTICLES

(71) Applicant: LAM RESEARCH AG, Villach (AT)

(72) Inventors: Karl-Heinz Hohenwarter, Dellach (AT); Bridget Hill, Villach (AT); Hongbo Si, Fremont, CA (US)

(73) Assignee: LAM RESEARCH AG, Villach (AT)

( * ) Notice: Subject to any disclaimer, the term of this patent is extended or adjusted under 35 U.S.C. 154(b) by 141 days.

(21) Appl. No.: 15/169,427

(22) Filed: May 31, 2016

(65) Prior Publication Data

US 2017/0345684 A1   Nov. 30, 2017

(51) Int. Cl.
*H01L 21/687* (2006.01)
*H01L 21/67* (2006.01)

(52) U.S. Cl.
CPC .... *H01L 21/6875* (2013.01); *H01L 21/67051* (2013.01); *H01L 21/67115* (2013.01); *H01L 21/68728* (2013.01); *H01L 21/68757* (2013.01); *H01L 21/68764* (2013.01)

(58) Field of Classification Search
CPC ................................................. H01L 21/68728
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,120,609 A | * 9/2000 | Selyutin | C23C 16/4583 118/500 |
| 2007/0199656 A1 | * 8/2007 | Leavitt | H01J 37/20 156/345.11 |
| 2010/0206481 A1 | * 8/2010 | Gigacher | H01L 21/67051 156/345.21 |
| 2013/0061873 A1 | * 3/2013 | Hohenwarter | H01L 21/02057 134/1.3 |

* cited by examiner

*Primary Examiner* — Spencer E Bell

(57) ABSTRACT

An apparatus for processing wafer-shaped articles comprises a rotary chuck adapted to hold a wafer shaped article thereon. The rotary chuck comprises a peripheral series of pins configured to contact an edge region of a wafer-shaped article. Each of the pins projects from the rotary chuck, and each of the pins comprises a projecting portion having a gripping element at a distal end thereof, and a proximal portion comprising a drive mechanism at a proximal end thereof by which the pin can be rotated. The projecting portion and the proximal portion comprise interengageable connectors configured to allow the projecting and proximal portions to be interconnected by pressing the projecting portion against the proximal portion and to be disconnected by pulling the projecting portion away from the proximal portion.

14 Claims, 1 Drawing Sheet

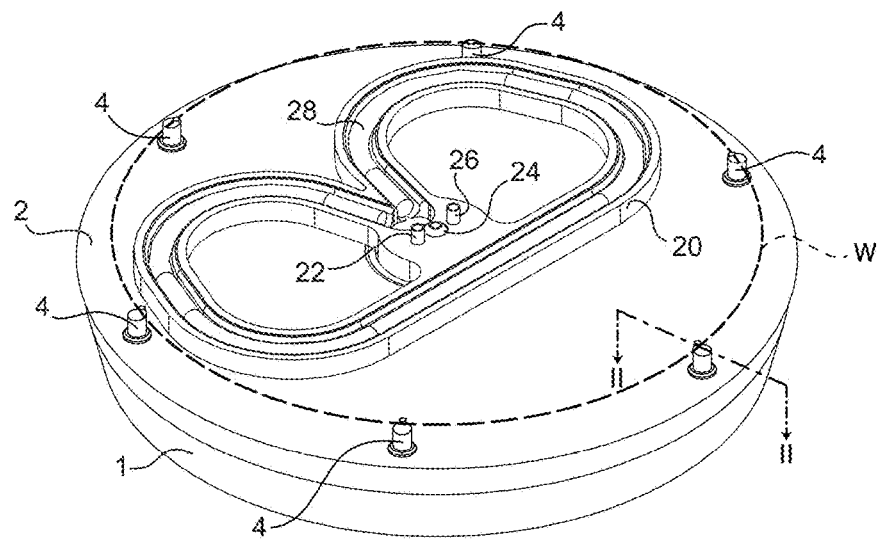
Fig. 1
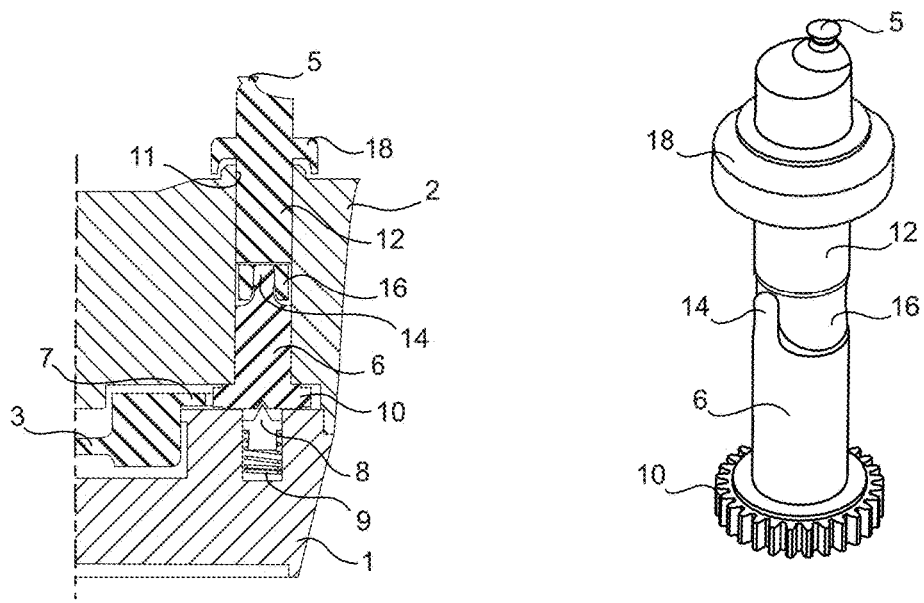
Fig. 2
Fig. 3

METHOD AND APPARATUS FOR LIQUID TREATMENT OF WAFER SHAPED ARTICLES

BACKGROUND OF THE INVENTION

1. Field of the Invention

The invention relates to apparatus for liquid treatment of wafer-shaped articles.

2. Description of Related Art

Semiconductor wafers undergo a variety of wet processing stages during manufacture of integrated circuits. To accommodate such processes, a single wafer may be supported in relation to one or more treatment fluid nozzles by a chuck associated with a rotatable or non-rotatable carrier.

U.S. Pat. Nos. 4,903,717 and 5,513,668 describe such chucks wherein a plurality of pins assemblies arranged in a circular series contact a peripheral edge of the wafer. The contact surfaces of the pin assemblies are eccentric to the rotational axes of the pin assemblies, and can thus be driven in unison by a common ring gear between a radially inward use position and a radially outward loading and unloading position. Commonly-owned copending application U.S. 2010/0206481 describes a variation on such pin assemblies in which the contact surfaces of the pin assemblies support the weight of the wafer, and position the wafer at a fixed height above the upper plate of the chuck.

More recent versions of such chucks have included heating assemblies that are positioned above the upper plate of the chuck but below the level where a wafer is supported, an example of such a chuck being described in commonly-owned copending application U.S. 2013/0061873.

The repair and maintenance of such chucks is relatively complicated and time-consuming, because, in order to replace even one of the pin assemblies, the chuck has to be disassembled from its associated drive and elevating unit, removed from its associated process module, and dismantled to its individual components under clean room conditions. This operation is especially time-consuming in the case of chucks equipped with heating assemblies as identified above, because the entire lamp housing has to be removed before the chuck itself can be removed from its associated drive unit.

SUMMARY OF THE INVENTION

Thus, in one aspect, the present invention relates to an apparatus for processing wafer-shaped articles, comprising a rotary chuck adapted to hold a wafer shaped article thereon. The rotary chuck comprises a peripheral series of pins configured to contact an edge region of a wafer-shaped article. Each of the pins projects from the rotary chuck, and each of the pins comprises a projecting portion having a gripping element at a distal end thereof, and a proximal portion comprising a drive mechanism at a proximal end thereof by which the pin can be rotated. The projecting portion and the proximal portion comprise interengageable connectors configured to allow the projecting and proximal portions to be interconnected by pressing the projecting portion against the proximal portion and to be disconnected by pulling the projecting portion away from the proximal portion.

In preferred embodiments of the apparatus according to the present invention, the rotary chuck comprises a chuck base body and a cover, and each of the pins projects from the cover.

In preferred embodiments of the apparatus according to the present invention, the rotary chuck is mounted for rotation about a central spindle, and a heating assembly is stationarily mounted above a projecting surface of the rotary chuck and below a level at which the pins contact an edge of a wafer-shaped article.

In preferred embodiments of the apparatus according to the present invention, the interengageble connectors are mating snap-fit elements.

In preferred embodiments of the apparatus according to the present invention, the interengageble connectors are mating twist-and-lock elements.

In preferred embodiments of the apparatus according to the present invention, the projecting and proximal portions are connectable via the interengageble connectors without use of a separate connecting element.

In preferred embodiments of the apparatus according to the present invention, the interengageble connectors are configured to prevent relative rotation of the projecting and proximal portions when interconnected.

In preferred embodiments of the apparatus according to the present invention, each of the projecting portions comprises a hood positioned beneath the gripping element and above its respective interengageable connector, the hood covering an opening in the spin chuck though which the projecting portion projects.

In preferred embodiments of the apparatus according to the present invention, the drive mechanism is a gear.

In preferred embodiments of the apparatus according to the present invention, a ring gear is mounted interiorly of the chuck, the ring gear being in simultaneous meshing engagement with each of the gears.

In preferred embodiments of the apparatus according to the present invention, each of the peripheral series of pins has an enlarged base confined within the rotary chuck and comprising gear teeth meshing with the ring gear.

In preferred embodiments of the apparatus according to the present invention, each of the series of pins is made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In another aspect, the present invention relates to a pin assembly for use in an apparatus for processing wafer-shaped articles, comprising a projecting portion having a gripping element at a distal end thereof, and a proximal portion comprising a drive mechanism at a proximal end thereof by which the pin can be rotated. The projecting portion and the proximal portion comprise interengageable connectors configured to allow the projecting and proximal portions to be interconnected by pressing the projecting portion inwardly against the proximal portion and to be disconnected by pulling the projecting portion outwardly relative to the proximal portion.

In preferred embodiments of the pin assembly according to the present invention, the interengageble connectors are mating snap-fit elements.

In preferred embodiments of the pin assembly according to the present invention, the interengageble connectors are mating twist-and-lock elements.

In preferred embodiments of the pin assembly according to the present invention, the interengageble connectors are configured to prevent relative rotation of the projecting and proximal portions when interconnected.

In preferred embodiments of the pin assembly according to the present invention, the projecting and proximal portions are connectable via the interengageble connectors without use of a separate connecting element.

In preferred embodiments of the pin assembly according to the present invention, each of the projecting portions comprises a hood positioned beneath the gripping element and above its respective interengageable connector.

In preferred embodiments of the pin assembly according to the present invention, the drive mechanism is a gear.

In preferred embodiments of the pin assembly according to the present invention, the projecting and proximal portions are made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In yet another aspect, the present invention relates to a removable component of a pin assembly for use in an apparatus for processing wafer-shaped articles, comprising a projecting portion having a gripping element at a distal end thereof, and a first connector at a proximal end thereof configured to interengage with a second connector of a proximal portion of a pin assembly. The first connector is configured to allow the projecting and proximal portions to be interconnected by pressing the projecting portion toward the proximal portion and to be disconnected by pulling the projecting portion away from the proximal portion.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 1 is a perspective view of an apparatus according to an embodiment of the present invention;

FIG. 2 is a partial sectional view taken along the line II-II of FIG. 1; and

FIG. 3 is a perspective view of a pin assembly according to an embodiment of the present invention.

DETAILED DESCRIPTION OF PREFERRED EMBODIMENTS

Referring now to the drawings, FIG. 1 depicts a spin chuck that holds a wafer W thereon in a generally horizontal orientation. The spin chuck includes a rotary base body 1 to which upper plate 2 is connected. A peripheral series of pins or pin assemblies 4 project upwardly through openings formed in the upper plate 2.

As shown in greater detail in FIG. 2, each pin assembly 4 comprises a proximal portion 6 having an enlarged based equipped with gear teeth 10, which mesh with the gear teeth 7 of a common ring gear 3 that drives all of the pin assemblies 4 in unison. Because the gripping element 5 of each pin assembly 4 is eccentric to the rotational axis of the pin assembly, that rotation displaces the gripping element 5 radially of the spin chuck, as described for example in U.S. Pat. Nos. 4,903,717 and 5,513,668. The correct positioning of the pin assemblies 4 is aided by respective needle bearings 8 and associated springs 9.

A radiant heating assembly, such as infra-red heating assembly 20 comprising one or more IR lamps 28 is positioned above the upper plate 2 of the chuck. The radiant heating assembly may alternatively comprise a multiplicity of blue LED lights. As described more fully in commonly-owned copending application U.S. 2013/0061873, the heating assembly 20 is mounted on a stationary post that passes through the center of the chuck, so that the heating assembly 20 remains stationary as the upper plate 2 and base body 1 of the chuck rotate. Furthermore, the heating assembly, although above the upper plate, is below the level at which a wafer W is held by pin assemblies 4, so that the heating assembly 20 heats a wafer W from the underside. The stationary structure also accommodates fluid supply nozzles 22, 24, 26, which supply respectively different gases and/or liquids to the underside of a wafer W.

Returning to FIGS. 2 and 3, each pin assembly 4 has two main components, the proximal portion 6 and a distal or projecting portion 12. The projecting portion 12 projects outwardly of the spin chuck through as opening 11 formed in the upper plate 2. The projecting portion 12 includes the eccentric gripping element 5 that contacts and supports a wafer W. The projecting portion 12 in this embodiment also includes a hood 18 positioned beneath the gripping element 5 that covers the opening 11 in the spin chuck though which the projecting portion 12 projects. The hood 18 helps prevent ingress of process chemicals into the opening 11.

The projecting portion 12 has at its proximal end a pair of flanges 16 which together define a recess that receives a male element 14 formed on the proximal portion 6. The projecting portion 12 and the proximal portion 6 are preferably both made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

While these materials will cause the projecting portion 12 and proximal portion 6 to be generally rigid, nevertheless, the configuration of the flanges 16 causes at least the portion having such flanges 16 to have a sufficient elasticity that the flanges 16 and male element 14 may be interengaged in a snap-fit manner. That is, the male element 14, which is slightly bulbous in cross-section, will spread apart the flanges 16 as the proximal portion 6 and projecting portion 12 are brought into engagement, and those flanges 16 will then snap back into place as the two components are fully engaged.

The projecting portion 12 may be disconnected from the proximal portion 6 by the opposite action, that is, simply by pulling the projecting portion 12 axially away from the proximal portion 6. Although a snap-lock mechanism is illustrated, a twist-and-lock or bayonet style for the interengaging flanges 16 and male element 14 could be provided instead.

It will be noted that the male element 14 is not a surface of revolution, but rather is elongated in the direction perpendicular to the page in FIG. 2, with the recess defined by flanges 16 having a complementary shape. In this way, the proximal portion 6 and projecting portion 12 are prevented by rotating relative to one another about the main axis of the pin assembly 4.

The configurations described above therefore permit easy replacement of a worn or broken projecting portion 12, without the need to disassemble the chuck or remove the proximal portion 6. Furthermore, it will be appreciated that this arrangement permits the proximal portion 6 and the projecting portion 12 to be securely interengaged with the need for any fastening elements such as bolts or screws or the like. Still further, the projecting portion 12 and the proximal portion 6 can be connected to one another and disconnected from one another manually, without the need for any tools.

If the projecting portion is made of a rigid material e.g. ceramics (like sintered alumina or silicon carbide), or silicon it is advantageous if the projecting portion carries the male element and the proximal portion caries the female element.

It shall also be noted that the material of the proximal portion could be selected from the standpoint of beneficial mechanical properties, whereas the material of the proximal portion could be selected for high chemical resistivity.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. An apparatus for processing wafer-shaped articles, comprising:
   a rotary chuck adapted to hold a wafer shaped article thereon; and
   a peripheral series of pins extending from the rotary chuck and configured to contact an edge region of a wafer-shaped article, each of said pins projecting from the rotary chuck, and each of said pins comprising
      a projecting portion having a gripping element at a distal first end thereof, and
      a proximal portion comprising a drive mechanism at a proximal end thereof by which said pin can be rotated, wherein said projecting portion and said proximal portion comprise interengageable connectors configured to allow said projecting and proximal portions to be interconnected by pressing said projecting portion against said proximal portion and to be disconnected by pulling said projecting portion away from said proximal portion,
   wherein said interengageable connector of said projecting portion includes a pair of flanges that define a recess between said pair of flanges, wherein said recess is configured to receive said interengageable connector of said proximal portion, and wherein said interengageable connector of said proximal portion is elongated in a direction complementary to the recess and perpendicular to a vertical axis of said pin such that rotation of the projecting portion relative to the proximal portion is prevented.

2. The apparatus according to claim 1, wherein said rotary chuck comprises a chuck base body and a cover, and wherein each of said pins projects from said cover.

3. The apparatus according to claim 1, wherein said rotary chuck is mounted for rotation about a central spindle, and wherein a heating assembly is stationarily mounted above a projecting surface of the rotary chuck and below a level at which said pins contact an edge of a wafer-shaped article.

4. The apparatus according to claim 1, wherein said projecting and proximal portions are connectable via said interengageable connectors without use of a separate connecting element.

5. The apparatus according to claim 1, wherein each of said projecting portions comprises a hood positioned beneath said gripping element and above its respective interengageable connector, said hood covering an opening in said rotary chuck though which said projecting portion projects.

6. The apparatus according to claim 1, wherein said drive mechanism is a gear.

7. The apparatus according to claim 6, further comprising a ring gear mounted interiorly of said chuck, said ring gear being in simultaneous meshing engagement with each of said gears.

8. The apparatus according to claim 7, wherein each of said peripheral series of pins has an enlarged base confined within said rotary chuck and comprising gear teeth meshing with said ring gear.

9. The apparatus according to claim 1, wherein each of said series of pins is made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

10. A pin assembly for use in an apparatus for processing wafer-shaped articles, comprising:
   a projecting portion having a gripping element at a distal end thereof; and
   a proximal portion comprising a drive mechanism at a proximal end thereof by which said pin assembly can be rotated, wherein said projecting portion and said proximal portion comprise interengageable connectors configured to allow said projecting and proximal portions to be interconnected by pressing said projecting portion inwardly against said proximal portion and to be disconnected by pulling said projecting portion outwardly relative to said proximal portion,
   wherein said interengageable connector of said projecting portion includes a pair of flanges that define a recess between said pair of flanges, wherein said recess is configured to receive said interengageable connector of said proximal portion, and wherein said interengageable connector of said proximal portion is elongated in a direction complementary to the recess and perpendicular to a vertical axis of said pin such that rotation of the projecting portion relative to the proximal portion is prevented.

11. The pin assembly according to claim 10, wherein said projecting and proximal portions are connectable via said interengageable connectors without use of a separate connecting element.

12. The pin assembly according to claim 10, wherein each of said projecting portions comprises a hood positioned beneath said gripping element and above its respective interengageable connector.

13. The pin assembly according to claim 10, wherein said drive mechanism is a gear.

14. The pin assembly according to claim 10, wherein said projecting and proximal portions are made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

* * * * *